(12) United States Patent
Shim et al.

(10) Patent No.: US 11,672,137 B2
(45) Date of Patent: Jun. 6, 2023

(54) ELECTROLUMINESCENT DISPLAY APPARATUS

(71) Applicant: LG Display Co., Ltd., Seoul (KR)

(72) Inventors: Sungbin Shim, Paju-si (KR); Suhyeon Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 203 days.

(21) Appl. No.: 17/133,941

(22) Filed: Dec. 24, 2020

(65) Prior Publication Data
US 2021/0202882 A1   Jul. 1, 2021

(30) Foreign Application Priority Data
Dec. 26, 2019   (KR) .......................... 10-2019-0175357

(51) Int. Cl.
| | | |
|---|---|---|
| *H10K 50/814* | (2023.01) | |
| *H01L 51/52* | (2006.01) | |
| *G02B 27/01* | (2006.01) | |
| *H01L 27/32* | (2006.01) | |
| *H01L 51/50* | (2006.01) | |

(52) U.S. Cl.
CPC ...... *H01L 51/5212* (2013.01); *G02B 27/0172* (2013.01); *H01L 27/3248* (2013.01); *H01L 27/3258* (2013.01); *H01L 51/5044* (2013.01); *H01L 51/5275* (2013.01)

(58) Field of Classification Search
CPC ............. H01L 51/5212; H01L 51/5218; H01L 27/3246; H01L 27/3248; H01L 27/3258
See application file for complete search history.

(56) References Cited

U.S. PATENT DOCUMENTS

| | | | |
|---|---|---|---|
| 9,142,780 B2* | 9/2015 | Shin | H01L 27/3244 |
| 2005/0116629 A1* | 6/2005 | Takamura | H01L 27/3283 313/506 |
| 2012/0095226 A1* | 4/2012 | Inoue | C07F 15/0033 544/225 |
| 2014/0014913 A1* | 1/2014 | Lee | H01L 21/76892 438/4 |
| 2015/0221893 A1* | 8/2015 | Teraguchi | H01L 27/3258 438/35 |
| 2017/0227777 A1* | 8/2017 | Carollo | G02B 27/286 |
| 2018/0006258 A1* | 1/2018 | Kim | H01L 27/3258 |
| 2018/0166522 A1* | 6/2018 | Kim | H01L 27/3248 |
| 2018/0351126 A1 | 12/2018 | Choi | |

FOREIGN PATENT DOCUMENTS

KR   10-2018-0133017 A   12/2018

* cited by examiner

*Primary Examiner* — Bryan R Junge
(74) *Attorney, Agent, or Firm* — Morgan, Lewis & Bockius LLP

(57) ABSTRACT

An electroluminescent display device includes a substrate having a first sub pixel and a second sub pixel, an auxiliary layer provided on the substrate, wherein the auxiliary layer includes a first auxiliary layer configured to surround the periphery of the first sub pixel, and a second auxiliary layer configured to surround the periphery of the second sub pixel, a first electrode provided in each of the first sub pixel and the second sub pixel, an emission layer provided on the first electrode, and a second electrode provided on the emission layer, wherein the first electrode provided in the first sub pixel is connected with the first auxiliary layer, and the first electrode provided in the second sub pixel is connected with the second auxiliary layer.

18 Claims, 10 Drawing Sheets

ELECTROLUMINESCENT DISPLAY APPARATUS

CROSS-REFERENCE TO RELATED APPLICATIONS

This application claims the benefit of the Korean Patent Application No. 10-2019-0175357 filed on Dec. 26, 2019, which is hereby incorporated by reference as if fully set forth herein.

BACKGROUND

Technical Field

The present disclosure relates to an electroluminescent display device.

Discussion of the Related Art

An electroluminescent display device is provided in such a way that an emission layer is provided between an anode electrode and a cathode electrode, and the emission layer emits light by an electric field generated between the above two electrodes, to thereby display an image.

The emission layer may be formed of an organic material which emits light when exciton is produced by a bond of electron and hole, and the exciton falls to a ground state from an excited state, or may be formed of an inorganic material such as quantum dot.

The emission layer may be configured to emit different colored light by each sub pixel, for example, red colored light, green colored light and blue colored light, or may be configured to emit the same colored light by each sub pixel, for example, white colored light.

In order to realize an electroluminescent display device with high resolution, it is necessary to compactly provide sub pixels at fixed intervals. However, it is not easy to precisely pattern a different-colored emission layer by each sub pixel through the use of mask. Accordingly, a method of depositing a plurality of stacks or emission layers without using a mask is favorable to a high-resolution electroluminescent display device.

However, a related art high-resolution electroluminescent display device has disadvantages of a low emission efficiency and a complicated manufacturing process.

SUMMARY

Accordingly, embodiments of the present disclosure are directed to an electroluminescent display device that substantially obviates one or more of the problems due to limitations and disadvantages of the related art.

The present disclosure has been made in view of the above problems, and an aspect of the present disclosure is to provide an electroluminescent display device which is capable of improving an emission efficiency and simplifying a manufacturing process.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an electroluminescent display device comprises a substrate having a first sub pixel and a second sub pixel, an auxiliary layer provided on the substrate, wherein the auxiliary layer includes a first auxiliary layer configured to surround a periphery of the first sub pixel, and a second auxiliary layer configured to surround a periphery of the second sub pixel, a first electrode provided in each of the first sub pixel and the second sub pixel, an emission layer provided on the first electrode, and a second electrode provided on the emission layer, wherein the first electrode provided in the first sub pixel is connected with the first auxiliary layer, and the first electrode provided in the second sub pixel is connected with the second auxiliary layer.

In another aspect, an electroluminescent display device comprises a substrate provided with a plurality of sub pixels including a first sub pixel and a second sub pixel, an overcoat layer including a first overcoat layer provided in the first sub pixel on the substrate, a second overcoat layer provided in the second sub pixel on the substrate, and a third overcoat layer provided in the boundary area between the first sub pixel and the second sub pixel on the substrate, a first electrode provided on the overcoat layer and provided in each of the first sub pixel and the second sub pixel, an emission layer provided on the first electrode, and a second electrode provided on the emission layer, wherein the first overcoat layer, the second overcoat layer, and the third overcoat layer are not connected with each other and are spaced apart from each other.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
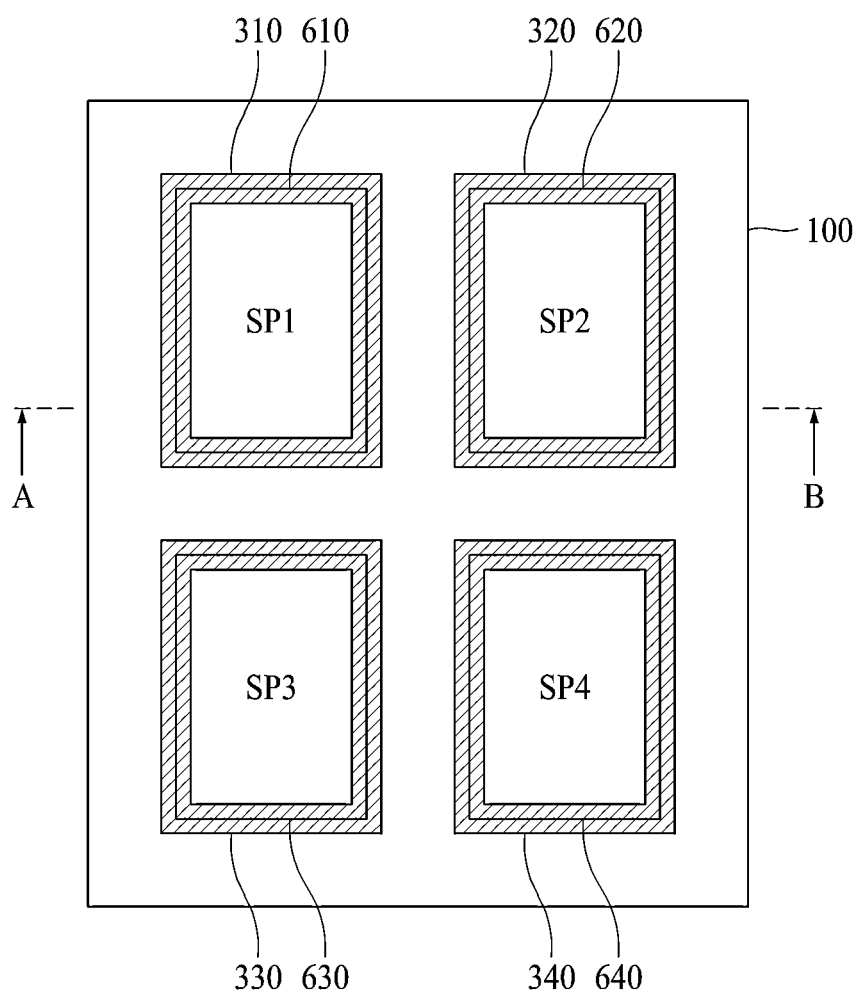
FIG. 1 is a plane view illustrating an electroluminescent display device according to one embodiment of the present disclosure.

Reference will now be made in detail to exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an electroluminescent display device according to the embodiment of the present disclosure will be described in detail with reference to the accompanying drawings.

FIG. 1 is a plane view illustrating an electroluminescent display device according to one embodiment of the present disclosure.

As shown in FIG. 1, the electroluminescent display device according to one embodiment of the present disclosure may include a substrate 100, an auxiliary layer 310, 320, 330 and 340, and a first electrode 610, 620, 630 and 640.

A plurality of sub pixels (SP1, SP2, SP3, SP4) are provided on the substrate 100.

The plurality of sub pixels (SP1, SP2, SP3, SP4) may include a first sub pixel (SP1), a second sub pixel (SP2), a third sub pixel (SP3), and a fourth sub pixel (SP4). A pixel may be defined by combination of the first to fourth sub pixels (SP1, SP2, SP3, SP4). The first sub pixel (SP1) is configured to emit first colored light, for example, red colored light, the second sub pixel (SP2) is configured to emit second colored light, for example, white colored light, the third sub pixel (SP3) is configured to emit third colored light, for example, blue colored light, and the fourth sub pixel (SP4) is configured to emit fourth colored light, for example, green colored light, but not limited to this structure.

The plurality of sub pixels (SP1, SP2, SP3, SP4) are arranged in '2×2' matrix configuration. Accordingly, the first sub pixel (SP1) and the second sub pixel (SP2) are sequentially arranged in the first row, and the third sub pixel (SP3) and the fourth sub pixel (SP4) are sequentially arranged in the second row, but not limited to this structure. For example, the plurality of sub pixels (SP1, SP2, SP3, SP4) may be arranged in a straight line, but not limited to this structure.

Also, according to another embodiment of the present disclosure, one pixel may be defined by combination of a red-color first sub pixel (SP1), a green-color second sub pixel (SP2), and a blue-color third sub pixel (SP3). In this case, the first to third sub pixels (SP1, SP2, SP3) may be arranged in a straight line, but not limited to this structure.

The auxiliary layer 310, 320, 330 and 340 may include a first auxiliary layer 310 surrounding the periphery of the first sub pixel (SP1), a second auxiliary layer 320 surrounding the periphery of the second sub pixel (SP2), a third auxiliary layer 330 surrounding the periphery of the third sub pixel (SP3), and a fourth auxiliary layer 340 surrounding the periphery of the fourth sub pixel (SP4). Thus, the auxiliary layer 310, 320, 330 and 340 may be formed in a shape corresponding to a shape in each of the plurality of sub pixels (SP1, SP2, SP3, SP4), for example, a rectangle-shaped frame structure. The frame structure indicates a structure which has rims and an empty center.

The first auxiliary layer 310 is configured to surround the periphery of the first electrode 610 in the first sub pixel (SP1), and at least some portions of the first auxiliary layer 310 are overlapped with the first electrode 610 of the first sub pixel (SP1). Similarly, each of the second to fourth auxiliary layers 320, 330 and 340 is configured to surround the periphery of the first electrode 620, 630 and 640 in each of the second to fourth sub pixels (SP2, SP3, SP4), and at least some portions in each of the second to fourth auxiliary layers 320, 330 and 340 are overlapped with the first electrode 620, 630 and 640 in each of the second to fourth sub pixels (SP2, SP3, SP4). The first auxiliary layer 310, the second auxiliary layer 320, the third auxiliary layer 330, and the fourth auxiliary layer 340 are electrically insulated from each other without being electrically connected with each other.

Each first electrode 610, 620, 630 and 640 is patterned in each of the first to fourth sub pixels (SP1, SP2, SP3, SP4). That is, one first electrode 610 is formed in the first sub pixel (SP1), another first electrode 620 is formed in the second sub pixel (SP2), another first electrode 630 is formed in the third sub pixel (SP3), and another first electrode 640 is formed in the fourth sub pixel (SP4).

Each first electrode 610, 620, 630 and 640 may function as an anode in each of the first to fourth sub pixels (SP1, SP2, SP3, SP4). Accordingly, each first electrode 610, 620, 630 and 640 is electrically connected with a source terminal or drain terminal of a driving thin film transistor patterned in each of the first to fourth sub pixels (SP1, SP2, SP3, SP4).

Figure 2:
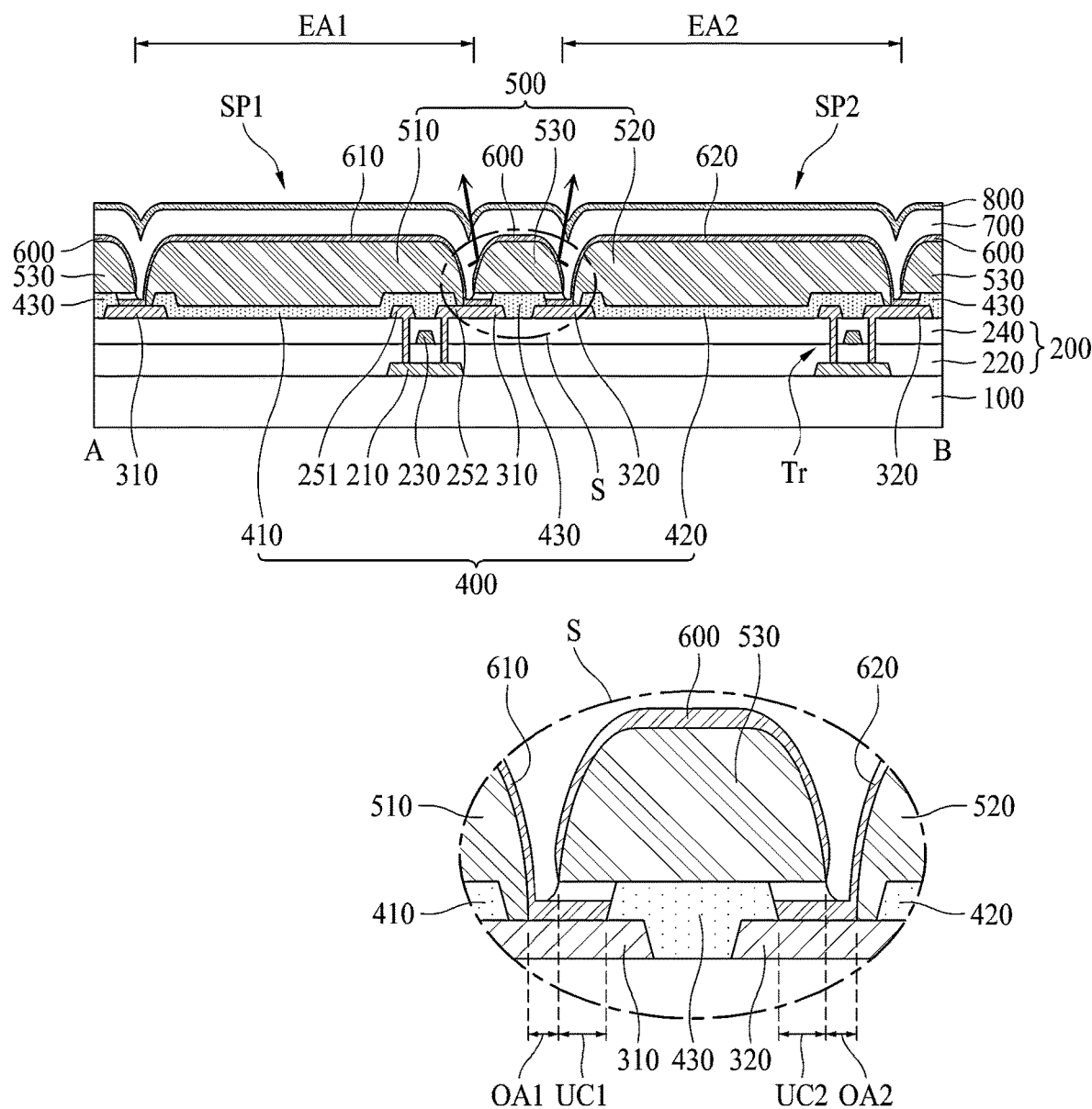
FIG. 2 is a cross sectional view illustrating the electroluminescent display device according to one embodiment of the present disclosure, which corresponds to a cross sectional view along A-B line of FIG. 1.
Figure 3:
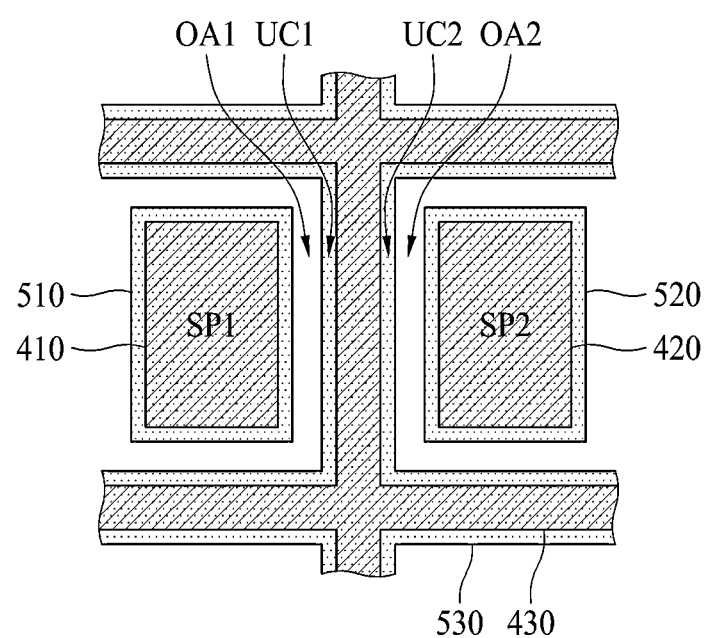
FIG. 3 is a plane view illustrating a passivation layer and an overcoat layer in the electroluminescent display device according to one embodiment of the present disclosure.

FIG. 2 is a cross sectional view illustrating the electroluminescent display device according to one embodiment of the present disclosure, which corresponds to a cross sectional view along A-B line of FIG. 1. FIG. 3 is a plane view illustrating a passivation layer and an overcoat layer in the electroluminescent display device according to one embodiment of the present disclosure.

As shown in FIG. 2, the electroluminescent display device according to one embodiment of the present disclosure may include a substrate 100, a circuit device layer 200, a passivation layer 400, an overcoat layer 500, a first electrode 610 and 620, an emission layer 700, and a second electrode 800.

The electroluminescent display device according to one embodiment of the present disclosure may be formed in a bottom emission type where emitted light advances downwardly. In this case, the substrate 100 may be formed of a transparent material such as glass or plastic. However, if the electroluminescent display device according to one embodiment of the present disclosure is formed in a top emission type where emitted light advances upwardly, the substrate 100 may be formed of an opaque material as well as the transparent material.

The circuit device layer 200 is formed on the substrate 100. In the circuit device layer 200, a driving thin film transistor (Tr) and an auxiliary layer 310 and 320 are formed by each sub pixel (SP1, SP2). In addition to the driving thin film transistor (Tr) and the auxiliary layer 310 and 320, various signal lines including a gate line, a data line, a power source line and a reference line, thin film transistors including a switching thin film transistor and a sensing thin film transistor, and a capacitor are provided in the circuit device layer 200.

The driving thin film transistor (Tr) is formed in each of the first sub pixel (SP1) and the second sub pixel (SP2). The driving thin film transistor (Tr) includes an active layer 210 on the substrate 100, a gate insulating film 220 on the active layer 210, a gate electrode 230 on the gate insulating film 220, an insulating interlayer 240 on the gate electrode 230, and a source electrode 251 and a drain electrode 252 which are provided on the insulating interlayer 240 and are respectively connected with one end and the other end of the active layer 210 via holes provided in the insulating interlayer 240 and the gate insulating film 220. Although not shown, in order to prevent ambient light from being introduced to the active layer 210, a light shielding layer may be additionally provided below the active layer 210. Herein, the driving thin film transistor (Tr) is formed in a top gate structure where the gate electrode 230 is provided above the active layer 210. However, it is possible to provide a driving thin film transistor (Tr) of a bottom gate structure where a gate electrode 230 is provided below an active layer 210. A structure of the driving thin film transistor (Tr) may be changed to various types generally known to those in the art.

The auxiliary layer 310 and 320 may include a first auxiliary layer 310 provided in the first sub pixel (SP1), and a second auxiliary layer 320 provided in the second sub pixel (SP2). The auxiliary layer 310 and 320 may be positioned in the same layer as those of the source and drain electrodes 251 and 252 of the driving thin film transistor (Tr), and may be formed of the same material as those of the source and drain electrodes 251 and 252 of the driving thin film transistor (Tr).

The first auxiliary layer 310 is provided in both peripheral sides of the first sub pixel (SP1). For example, the first auxiliary layer 310 provided in one side of the first sub pixel (SP1), that is, a right peripheral side of the first sub pixel (SP1) may be connected with the drain electrode 252 of the driving thin film transistor (Tr) of the first sub pixel (SP1). If needed, the first auxiliary layer 310 may be connected with the source electrode 251 of the driving thin film transistor (Tr) of the first sub pixel (SP1). In this case, the first auxiliary layer 310 may be formed as one body with the drain electrode 252 or source electrode 251.

Similarly, the second auxiliary layer 320 is provided in both peripheral sides of the second sub pixel (SP2). For example, the second auxiliary layer 320 provided in one side of the second sub pixel (SP2), that is, a right peripheral side of the second sub pixel (SP2) may be connected with the drain electrode 252 of the driving thin film transistor (Tr) of the second sub pixel (SP2). If needed, the second auxiliary layer 320 may be connected with the source electrode 251 of the driving thin film transistor (Tr) of the second sub pixel (SP2). In this case, the second auxiliary layer 320 may be formed as one body with the drain electrode 252 or source electrode 251.

The second auxiliary layer 320 provided in the other side of the second sub pixel (SP2), that is, a left peripheral side of the second sub pixel (SP2) confronts the first auxiliary layer 310 provided in one side of the first sub pixel (SP1), that is, the right peripheral side of the first sub pixel (SP1) under the condition a third passivation layer 430 is interposed in-between. Accordingly, in the boundary area between the first sub pixel (SP1) and the second sub pixel (SP2), the first auxiliary layer 310 and the second auxiliary layer 320 confront each other.

The passivation layer 400 is provided on the circuit device layer 200, and more particularly, on the source electrode 251 and drain electrode 252 of the driving thin film transistor (Tr), and the auxiliary layer 310 and 320. The passivation layer 400 may be formed of an inorganic insulating material, but not limited to this material.

The passivation layer 400 includes a first passivation layer 410 provided in the first sub pixel (SP1), a second passivation layer 420 provided in the second sub pixel (SP2), and the third passivation layer 430 provided between the first passivation layer 410 and the second passivation layer 420. The third passivation layer 430 may be provided in the boundary area between the first sub pixel (SP1) and the second sub pixel (SP2).

The first passivation layer 410 and the third passivation layer 430 are spaced apart from each other, and at least some portions of the first auxiliary layer 310 may be exposed in the spaced area between the first passivation layer 410 and the third passivation layer 430. Also, the second passivation layer 420 and the third passivation layer 430 are spaced apart from each other, and at least some portions of the second auxiliary layer 320 may be exposed in the spaced area between the second passivation layer 420 and the third passivation layer 430.

Referring to FIG. 3, the first passivation layer 410 is formed in an island shape corresponding to a shape of the first sub pixel (SP1), the second passivation layer 420 is formed in an island shape corresponding to a shape of the second sub pixel (SP2), and the third passivation layer 430 may be formed as a mesh shape in the boundary area between each of the sub pixels (SP1, SP2) while being configured to surround the first sub pixel (SP1) and the second sub pixel (SP2). In this case, the first passivation layer 410 and the third passivation layer 430 are spaced apart from each other at a predetermined interval, and are not connected with each other, and the second passivation layer 420 and the third passivation layer 430 are spaced apart from each other at a predetermined interval, and are not connected with each other. Thus, the first passivation layer 410 and the second passivation layer 420 are also spaced apart from each other at a predetermined interval, and are not connected with each other.

Referring once again to FIG. 2, the overcoat layer 500 is provided on the passivation layer 400. The overcoat layer 500 may be formed of an organic insulating material, but not limited to this material. The overcoat layer 500 may include a first overcoat layer 510 provided in the first sub pixel (SP1), a second overcoat layer 520 provided in the second sub pixel (SP2), and a third overcoat layer 530 provided between the first overcoat layer 510 and the second overcoat layer 520. The third overcoat layer 530 may be provided in the boundary area between the first sub pixel (SP1) and the second sub pixel (SP2).

The first overcoat layer 510 is provided on the first passivation layer 410, the second overcoat layer 520 is provided on the second passivation layer 420, and the third overcoat layer 530 is provided on the third passivation layer 430. The first overcoat layer 510 and the third overcoat layer 530 are spaced apart from each other under the condition that a first opening area (OA1) is interposed in-between. The second overcoat layer 520 and the third overcoat layer 530 are spaced apart from each other under the condition that a second opening area (OA2) is interposed in-between.

The first overcoat layer 510 may be configured to have a width which is relatively larger than a width of the first passivation layer 410. In detail, the first overcoat layer 510 may extend from each of one side and the other side of the first passivation layer 410, and may be in contact with some portions of an upper surface of the first auxiliary layer 310. The second overcoat layer 520 may be configured to have a width which is relatively larger than a width of the second passivation layer 420. In detail, the second overcoat layer 520 may extend from each of one side and the other side of the second passivation layer 420, and may be in contact with some portions of an upper surface of the second auxiliary layer 320. The third overcoat layer 530 may be configured to have a width which is relatively larger than a width of the third passivation layer 430. In detail, the third overcoat layer 530 may extend from each of one side and the other side of the third passivation layer 430, however, the third overcoat layer 530 is not in contact with the first auxiliary layer 310 and the second auxiliary layer 320. Accordingly, a first undercut area (UC1) and a second undercut area (UC2) are provided below the third overcoat layer 530.

The first undercut area (UC1), which corresponds to a space between the first auxiliary layer 310 and the third overcoat layer 530, is in communication with the first opening area (OA1). Accordingly, the first auxiliary layer 310 is exposed in the first opening area (OA1) and the first undercut area (UC1).

The first opening area (OA1) corresponds to the area in which the overcoat layer 500 is not formed, and the first opening area (OA1) is provided in the spaced area between the first overcoat layer 510 and the third overcoat layer 530. The first undercut area (UC1) is provided in the area between the third overcoat layer 530 and the first auxiliary layer 310, and from which the third passivation layer 430 is removed. The first undercut area (UC1) and the first opening area (OA1) are in contact with each other, and are in communication with each other. The first opening area (OA1) is the area which is exposed without being covered by the overcoat layer 500, and the first opening area (OA1) is the area in which the passivation layer 400 is not formed. The first undercut area (UC1) is covered by the third overcoat layer 530. However, the first undercut area (UC1) corresponds to the area which is formed by removing a predetermined portion of the third passivation layer 430 through a permeation of etchant below one end of the third overcoat layer 530. During the permeation of etchant, the first auxiliary layer 310 functions as an etch stopper, whereby the first auxiliary layer 310 and the circuit device layer 200 positioned thereunder are not etched by the etchant.

The second undercut area (UC2), which corresponds to a space between the second auxiliary layer 320 and the third overcoat layer 530, is in communication with the second opening area (OA2). Accordingly, the second auxiliary layer 320 is exposed in the second opening area (OA2) and the second undercut area (UC2).

The second opening area (OA2) corresponds to the area in which the overcoat layer 500 is not formed, and the second opening area (OA2) is provided in the spaced area between the second overcoat layer 520 and the third overcoat layer 530. The second undercut area (UC2) is provided in the area between the third overcoat layer 530 and the second auxiliary layer 320, and from which the third passivation layer 430 is removed. The second undercut area (UC2) and the second opening area (OA2) are in contact with each other, and are in communication with each other. The second opening area (OA2) is the area which is exposed without being covered by the overcoat layer 500, and the second opening area (OA2) is the area in which the passivation layer 400 is not formed. The second undercut area (UC2) is covered by the third overcoat layer 530. However, the second undercut area (UC2) corresponds to the area which is formed by removing a predetermined portion of the third passivation layer 430 through a permeation of etchant below the other end of the third overcoat layer 530. During the permeation of etchant, the second auxiliary layer 320 functions as an etch stopper, whereby the second auxiliary layer 320 and the circuit device layer 200 positioned thereunder are not etched by the etchant.

Referring to FIG. 3, the first overcoat layer 510 is formed in an island shape corresponding to a shape of the first sub pixel (SP1), the second overcoat layer 520 is formed in an island shape corresponding to a shape of the second sub pixel (SP2), and the third overcoat layer 530 may be formed as a mesh shape in the boundary area between each of the sub pixels (SP1, SP2) while being configured to surround the first sub pixel (SP1) and the second sub pixel (SP2).

The first overcoat layer 510 having a size which is relatively larger than a size of the first passivation layer 410 is overlapped with the first passivation layer 410. The second overcoat layer 520 having a size which is relatively larger than a size of the second passivation layer 420 is overlapped with the second passivation layer 420. The third overcoat layer 530 having a size which is relatively larger than a size of the third passivation layer 430 is overlapped with the third passivation layer 430.

The first overcoat layer 510 and the third overcoat layer 530 are spaced apart from each other at a predetermined interval under the condition that the first opening area (OA1) is interposed in-between. The second overcoat layer 520 and the third overcoat layer 530 are spaced apart from each other at a predetermined interval under the condition that the second opening area (OA2) is interposed in-between. Accordingly, the first overcoat layer 510 and the second overcoat layer 520 are spaced apart from each other, and are not connected with each other.

Referring once again to FIG. 2, the first electrode 610 and 620 is patterned in each of the first and second sub pixels (SP1, SP2) while being provided on the overcoat layer 510 and 520.

The first electrode 610 provided in the first sub pixel (SP1) extends to the first undercut area (UC1) via the first opening area (OA1) and upper and lateral surfaces of the first overcoat layer 510. Thus, the first electrode 610 provided in the first sub pixel (SP1) is brought into contact with the upper surface of the first auxiliary layer 310 in the first opening area (OA1) and the first undercut area (UC1). Eventually, the first electrode 610 provided in the first sub pixel (SP1) is connected with the drain electrode 252 or source electrode 251 of the driving thin film transistor (Tr) in the first sub pixel (SP1) through the use of first auxiliary layer 310. The first auxiliary layer 310 serves as the medium of connection between the first electrode 610 and the drain electrode 252 or source electrode 251 of the driving thin film transistor (Tr).

The first electrode 620 provided in the second sub pixel (SP2) extends to the second undercut area (UC2) via the second opening area (OA2) and upper and lateral surfaces of the second overcoat layer 520. Thus, the first electrode 620 provided in the second sub pixel (SP2) is brought into contact with the upper surface of the second auxiliary layer 320 in the second opening area (OA2) and the second undercut area (UC2). Eventually, the first electrode 620 provided in the second sub pixel (SP2) is connected with the drain electrode 252 or source electrode 251 of the driving thin film transistor (Tr) in the second sub pixel (SP2) through the use of second auxiliary layer 320. The second auxiliary layer 320 serves as the medium of connection between the first electrode 620 and the drain electrode 252 or source electrode 251 of the driving thin film transistor (Tr).

Meanwhile, a conductive layer 600 is provided on upper and lateral surfaces of the third overcoat layer 530 prepared in the boundary area between the first sub pixel (SP1) and the second sub pixel (SP2). The conductive layer 600 is spaced apart from each of the first electrode 610 in the first sub pixel (SP1) and the first electrode 620 in the second sub pixel (SP2), and is not connected with each of the first electrode 610 in the first sub pixel (SP1) and the first electrode 620 in the second sub pixel (SP2). The conductive layer 600 is formed in the same pattern as that of the third overcoat layer 530.

The conductive layer 600 and the first electrode 610 and 620 are formed of the same material, and are manufactured by the same process. In detail, if a predetermined conductive material is deposited on the first to third overcoat layers 510, 520 and 530 by a deposition process such as a sputtering process having an inferior straightness of a deposition material, the conductive material is deposited on the first to third overcoat layers 510, 520 and 530, and also may be deposited on the first auxiliary layer 310 and the second auxiliary layer 320 through the permeation into the first and second opening areas (OA1, OA2) and the first and second undercut areas (UC1, UC2). Accordingly, one first electrode 610 which extends to the first opening area (OA1) and the first undercut area (UC1) is formed on the first overcoat layer 510, another first electrode 620 which extends to the second opening area (OA2) and the second undercut area (UC2) is formed on the second overcoat layer 520, and the conductive layer 600 is formed on the third overcoat layer 530.

In this case, the third overcoat layer 530 is spaced apart from the first and second auxiliary layers 310 and 320, whereby the conductive layer 600 provided on the third overcoat layer 530 is not connected with and is spaced apart from one first electrode 610 and another first electrode 620. Thus, one first electrode 610 and another first electrode 620 are spaced apart from each other, and one first electrode 610 and another first electrode 620 are respectively patterned in the first sub pixel (SP1) and the second sub pixel (SP2).

According to one embodiment of the present disclosure, the first electrode 610 and 620 may be patterned in each individual sub pixel (SP1, SP2) without an additional mask process, to thereby simplify a manufacturing process.

The emission layer 700 is provided on the conductive layer 600 and the first electrode 610 and 620. The emission layer 700 is continuously provided in the space between the first sub pixel (SP1) and the second sub pixel (SP2) as well as the first sub pixel (SP1) and the second sub pixel (SP2) without any disconnection. The emission layer 700 may be formed by a deposition process such as an evaporation process with a good straightness of a deposition material. Thus, the emission layer 700 may not permeate into the first and second undercut areas (UC1, UC2), whereby an empty space which is not filled with the emission layer 700 may be provided in the first and second undercut areas (UC1, UC2).

In the first sub pixel (SP1), a predetermined area of the emission layer 700, which is in contact with the first electrode 610, becomes a first emission area (EA1). In the second sub pixel (SP2), a predetermined area of the emission layer 700, which is in contact with the first electrode 620, becomes a second emission area (EA2). The first emission area (EA1) may include an area between the third overcoat layer 530 disposed at one side and the third overcoat layer 530 disposed at the other side under the condition that the first overcoat layer 510 is interposed in-between. The second emission area (EA2) may include an area between the third overcoat layer 530 disposed at one side and the third overcoat layer 530 disposed at the other side under the condition that the second overcoat layer 520 is interposed in-between.

According to one embodiment of the present disclosure, as shown in an arrow, light emitted from the emission layer 700 is reflected on the area of the third overcoat layer 530, and more particularly, on the conductive layer 600 provided on a lateral surface of the third overcoat layer 530, and is then advanced to each emission area (EA1, EA2), whereby it enables to improve an emission efficiency. Also, according to one embodiment of the present disclosure, a width of the third overcoat layer 530 is decreased so that it is possible to increase a size of the emission area (EA1, EA2), to thereby improve an aperture ratio.

Meanwhile, the emission layer 700 is not provided on both ends of the first electrode 610 and 620. Thus, even though a current is focused on the area corresponding to the both ends of the first electrode 610 and 620, a light emission does not occur therein. That is, there is no need for an additional bank for covering the both ends of the first electrode 610 and 620. Even if the emission layer 700 permeates into the first and second undercut areas (UC1, UC2), and are provided on the area corresponding to the both ends of the first electrode 610 and 620, a light emission does not occur in the area corresponding to the both ends of the first electrode 610 and 620 due to the third overcoat layer 530 provided in the first and second undercut areas (UC1, UC2), whereby there is no need for an additional bank.

According to one embodiment of the present disclosure, there is no need for an additional bank so that it has an advantage of a simplified manufacturing process.

The emission layer 700 is configured to emit white colored light. In this case, the emission layer 700 may be formed in a structure comprising a plurality of stacks. For example, the emission layer 700 may include a first stack configured to emit first colored light such as blue color or yellowish green color, a second stack configured to emit second colored light such as yellowish green color or blue color, and N-type and P-type charge generation layers provided between the first stack and the second stack. In this case, the first stack may include a first hole transport layer, a first organic emission layer configured to emit the first colored light, and a first electron transport layer, which are deposited in sequence, and the second stack may include a second hole transport layer, a second organic emission layer configured to emit the second colored light, and a second electron transport layer, which are deposited in sequence, but not limited to these structures.

Meanwhile, the emission layer 700 is continuously provided in the area between the first sub pixel (SP1) and the second sub pixel (SP2) as well as the first sub pixel (SP1) and the second sub pixel (SP2) without any disconnection, whereby there is a possibility of a leakage current in the area between the first sub pixel (SP1) and the second sub pixel (SP2). Especially, the N-type charge generation layer included in the emission layer 700 has good conductivity. Thus, a leakage current may be generated due to a charge transfer between the neighboring sub pixels (SP1, SP2) through the N-type charge generation layer. However, according to one embodiment of the present disclosure, on the basis of the characteristics of the deposition process, a thickness of the emission layer 700 deposited on the lateral surface of the third overcoat layer 530 is relatively small so that a resistance is increased in the corresponding area, to thereby lower an occurrence of a leakage current between the neighboring sub pixels (SP1, SP2).

The second electrode 800 is provided on the emission layer 700. The second 800 is continuously provided in the area between the first sub pixel (SP1) and the second sub pixel (SP2) as well as the first sub pixel (SP1) and the second sub pixel (SP2) without any disconnection. The second electrode 800 may function as a cathode of the electroluminescent display device.

If the electroluminescent display device according to one embodiment of the present disclosure is formed in a bottom emission type, the second electrode 800 includes a reflective electrode, and the first electrode 610 and 620 may include a transparent electrode. Meanwhile, if the electroluminescent display device according to one embodiment of the present disclosure is formed in a top emission type, the second electrode 800 includes a transparent electrode, and the first electrode 610 and 620 may include a reflective electrode.

Although not shown, an encapsulation layer may be additionally provided on the second electrode 800, wherein the encapsulation layer prevents external moisture from being permeated into the emission layer 700. The encapsulation layer may be formed of an inorganic insulating material, or may be formed in an alternate deposition structure by alternately depositing an inorganic insulating material and an organic insulating material, but not limited to these structures.

Also, although not shown, according to one embodiment of the present disclosure, a color filter may be provided by each sub pixel (SP1, SP2). If the electroluminescent display device according to one embodiment of the present disclosure is formed in a bottom emission type, the color filter may be provided in the circuit device layer 200. If the electroluminescent display device according to one embodiment of the present disclosure is formed in a top emission type, the color filter may be provided on the second electrode 800.

Figure 4:
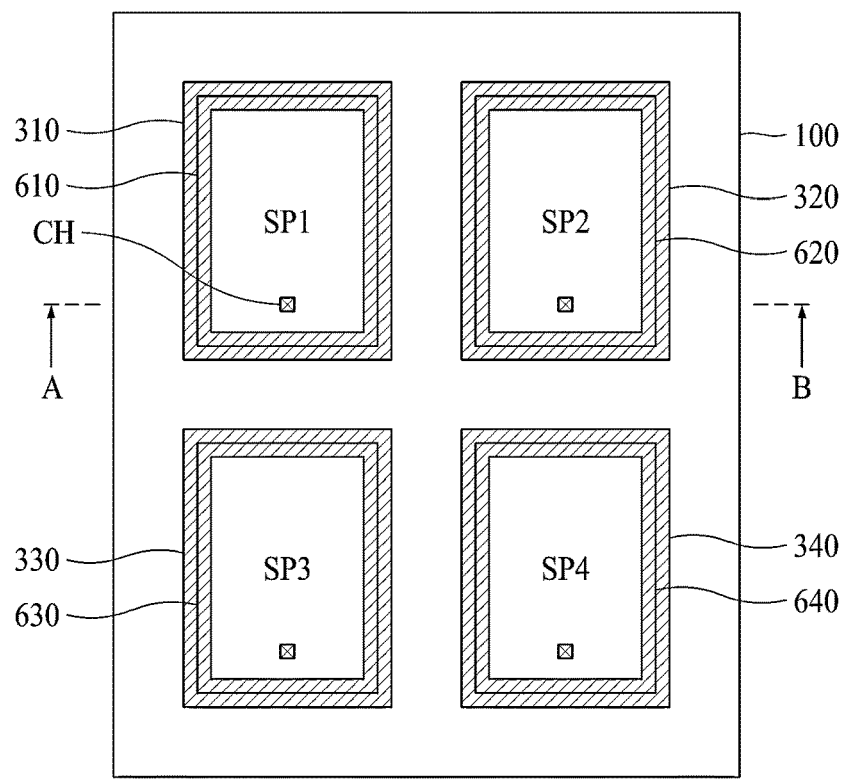
FIG. 4 is a plane view illustrating an electroluminescent display device according to another embodiment of the present disclosure.
Figure 5:
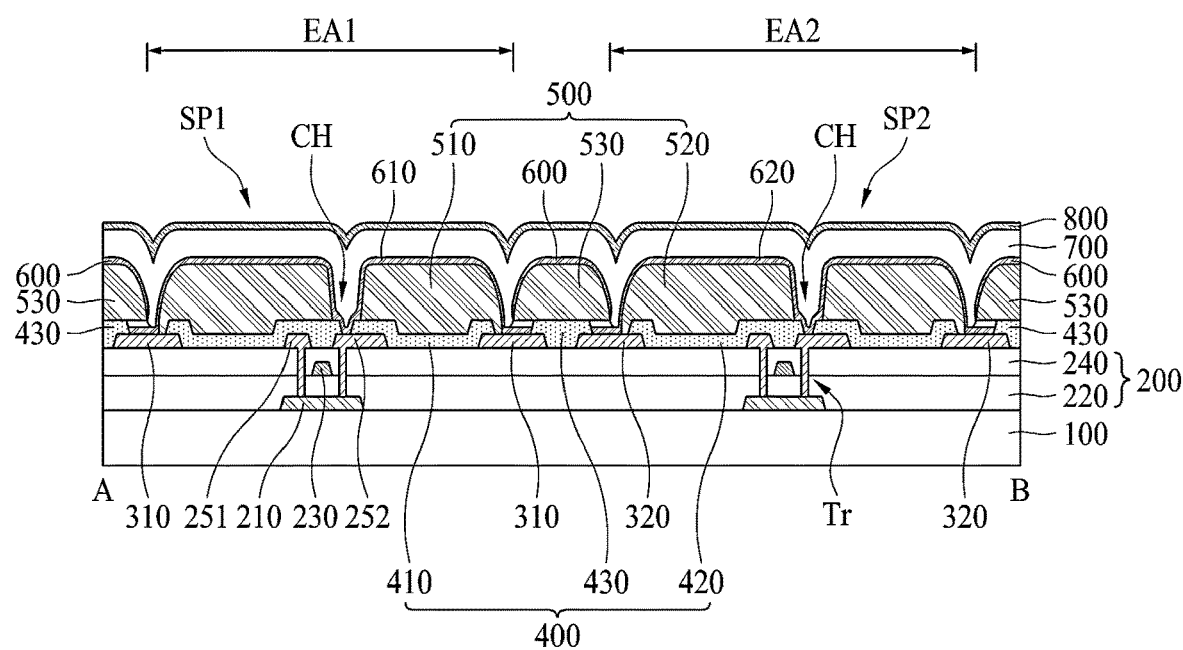
FIG. 5 is a cross sectional view along A-B line of FIG. 4.

FIG. 4 is a plane view illustrating an electroluminescent display device according to another embodiment of the present disclosure. FIG. 5 is a cross sectional view along A-B line of FIG. 4.

The electroluminescent display device shown in FIGS. 4 and 5 is different from the electroluminescent display device shown in FIGS. 1 to 3 in that the electroluminescent display device shown in FIGS. 4 and 5 includes an additional contact hole (CH). Thus, the same reference numbers will be used throughout the drawings to refer to the same or like parts, and only the different parts will be described in detail.

As shown in FIG. 4, according to another embodiment of the present disclosure, the contact hole (CH) is provided by each individual sub pixel (SP1, SP2, SP3, SP4). Through the contact hole (CH), each first electrode 610, 620, 630 and 640 is connected with a source electrode or drain electrode of a driving thin film transistor provided in each sub pixel (SP1, SP2, SP3, SP4).

In the aforementioned embodiment shown in FIG. 1, the first electrode 610, 620, 630 and 640 is connected with the auxiliary layer 310, 320, 330 and 340 in each sub pixel (SP1, SP2, SP3, SP4), and the auxiliary layer 310, 320, 330 and 340 is connected with the source electrode or drain electrode of the driving thin film transistor provided in each sub pixel (SP1, SP2, SP3, SP4). Especially, as shown in FIG. 2, the first electrode 610 and 620 is connected with the auxiliary layer 310 and 320 in the opening area (OA1, OA2) and the undercut area (UC1, UC2), whereby the additional contact hole is not provided therein.

In contrast, in case of the embodiment shown in FIGS. 4 and 5, the first electrode 610, 620, 630, and 640 is connected with an auxiliary layer 310, 320, 330 and 340 in each sub pixel (SP1, SP2, SP3, SP4), however, the auxiliary layer 310, 320, 330 and 340 is not connected with the source electrode 251 or drain electrode 252 of the driving thin film transistor provided in each sub pixel (SP1, SP2, SP3, SP4). Accordingly, the first electrode 610, 620, 630 and 640 is connected with the source electrode 251 or drain electrode 252 of the driving thin film transistor through the additionally prepared contact hole (CH). The contact hole (CH) may be not overlapped with the auxiliary layer 310, 320, 330 and 340. The contact hole (CH) may be provided in various positions inside each sub pixel (SP1, SP2, SP3, SP4).

In more detail, as shown in FIG. 5, the contact hole (CH) is provided in a first passivation layer 410 and a first overcoat layer 510 provided in the first sub pixel (SP1), and the drain electrode 252 or source electrode 251 of the thin film transistor (Tr) is exposed via the contact hole (CH). Accordingly, the first electrode 610 provided on the first overcoat layer 510 is connected with the drain electrode 252 or source electrode 251 of the thin film transistor (Tr) through the contact hole (CH).

In this case, the first auxiliary layer 310 is not connected with the drain electrode 252 or source electrode 251 of the thin film transistor (Tr) provided in the first sub pixel (SP1). Thus, the first opening area (OA1) and the first undercut area (UC1), in which the first auxiliary layer 310 is exposed, are not overlapped with the contact hole (CH). The first auxiliary layer 310 does not function as the medium for an electrical connection between the first electrode 610 and the drain electrode 252 or source electrode 251 of the thin film transistor (Tr). Thus, it is possible to provide the first auxiliary layer 310 of a non-conductive material.

Similarly, the contact hole (CH) is provided in a second passivation layer 420 and a second overcoat layer 520 provided in the second sub pixel (SP2), and the drain electrode 252 or source electrode 251 of the thin film transistor (Tr) is exposed via the contact hole (CH). Accordingly, the first electrode 620 provided on the second overcoat layer 520 is connected with the drain electrode 252 or source electrode 251 of the thin film transistor (Tr) through the contact hole (CH).

In this case, the second auxiliary layer 320 is not connected with the drain electrode 252 or source electrode 251 of the thin film transistor (Tr) provided in the second sub pixel (SP2). Thus, the second opening area (OA2) and the second undercut area (UC2), in which the second auxiliary layer 320 is exposed, are not overlapped with the contact hole (CH). The second auxiliary layer 320 does not function as the medium for an electrical connection between the first electrode 620 and the drain electrode 252 or source electrode 251 of the thin film transistor (Tr). Thus, it is possible to provide the second auxiliary layer 320 of a non-conductive material.

Figure 6:
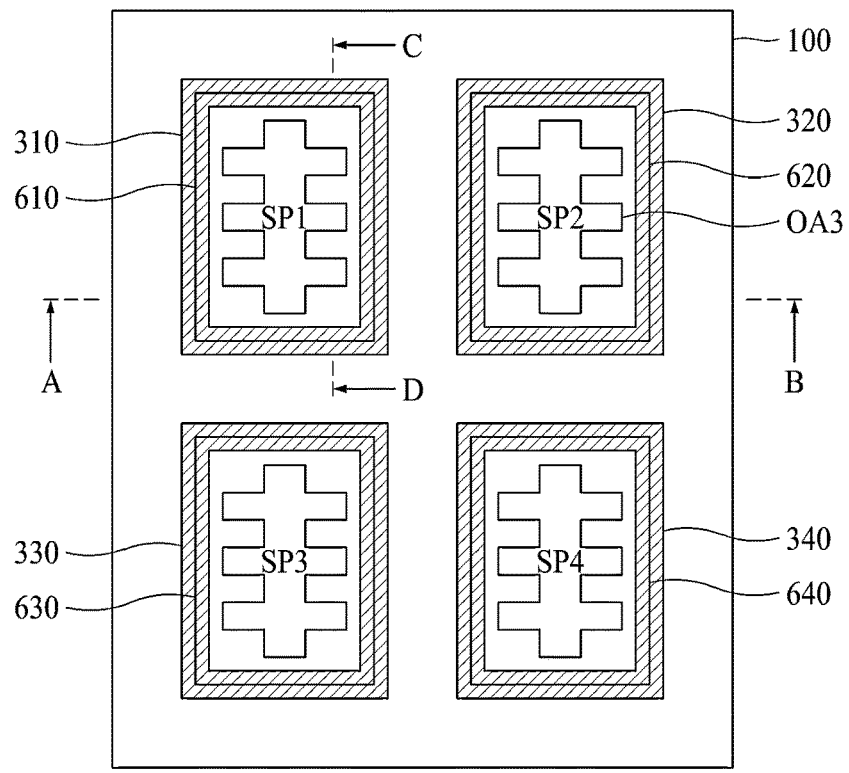
FIG. 6 is a plane view illustrating an electroluminescent display device according to another embodiment of the present disclosure.
Figure 7:
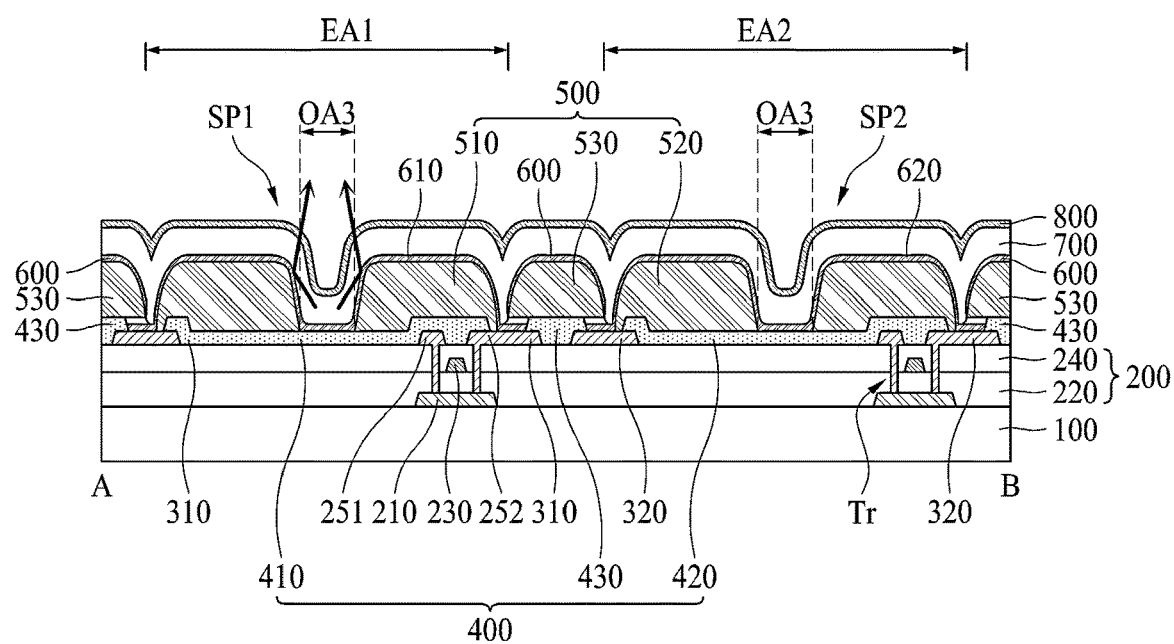
FIG. 7 is a cross sectional view along A-B line of FIG. 6.
Figure 8:
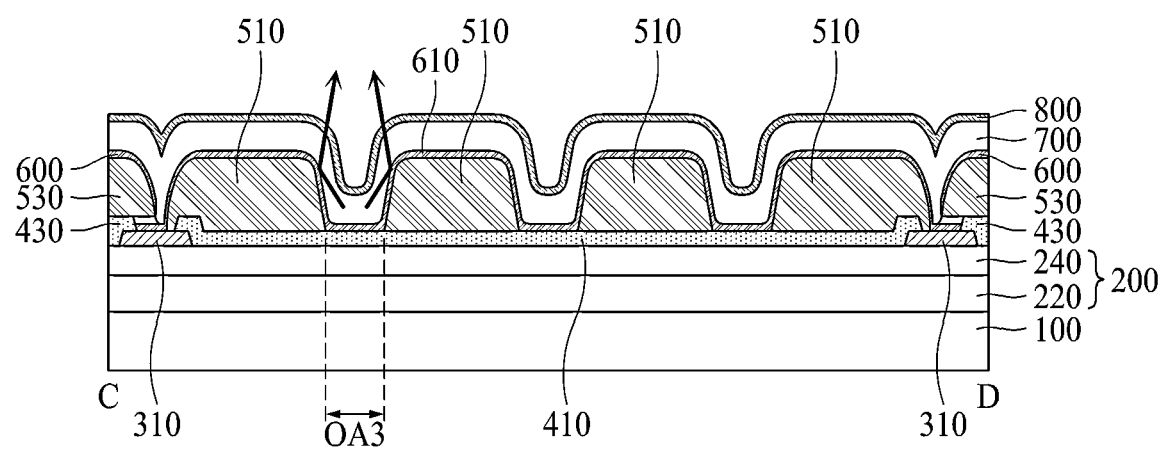
FIG. 8 is a cross sectional view along C-D line of FIG. 6.

FIG. 6 is a plane view illustrating an electroluminescent display device according to another embodiment of the present disclosure. FIG. 7 is a cross sectional view along A-B line of FIG. 6. FIG. 8 is a cross sectional view along C-D line of FIG. 6. The electroluminescent display device shown in FIGS. 6 to 8 is different from the electroluminescent display device shown in FIGS. 1 to 3 in that the electroluminescent display device shown in FIGS. 6 to 8 includes an additional third opening area (OA3). Thus, the same reference numbers will be used throughout the drawings to refer to the same or like parts, and only the different parts will be described in detail.

As shown in FIG. 6, the third opening area (OA3) is provided in each individual sub pixel (SP1, SP2, SP3, SP4). As shown in FIG. 6, the third opening area (OA3) may be formed in a structure comprising a plurality of "+" shapes connected with each other on the plane view, but not limited to this structure. For example, the third opening area (OA3) may be changed to various structures, for example, a straight-line structure, a curved-line structure, a stripe structure comprising a plurality of straight lines or curved lines provided consecutively, or a mesh structure on the plane view.

As shown in FIG. 7, the third opening area (OA3) is provided in a first overcoat layer 510 of the first sub pixel (SP1). In the third opening area (OA3), a first passivation layer 410 is exposed. That is, the third opening area (OA3) may be not provided in the first passivation layer 410, but not limited to this structure. A first electrode 610 of the first sub pixel (SP1) extends to the third opening area (OA3) along a lateral surface of the first overcoat layer 510 which is in contact with the third opening area (OA3), and is provided to cover an upper surface of the first passivation layer 410 which is exposed to the third opening area (OA3).

Similarly, the third opening area (OA3) is provided in a second overcoat layer 520 of the second sub pixel (SP2). In the third opening area (OA3), a second passivation layer 420 is exposed. That is, the third opening area (OA3) may be not provided in the second passivation layer 420, but not limited to this structure. A first electrode 620 of the second sub pixel (SP2) extends to the third opening area (OA3) along a lateral surface of the second overcoat layer 520 which is in contact with the third opening area (OA3), and is provided to cover an upper surface of the second passivation layer 420 which is exposed to the third opening area (OA3).

According to another embodiment of the present disclosure, as shown in an arrow, light emitted from an emission layer 700 is reflected on the first electrode 610 and 620 formed on the lateral surface of the overcoat layer 510 and 520 which is in contact with the third opening area (OA3), and is then advanced to each emission area (EA1, EA2), whereby it enables to improve an emission efficiency.

Especially, as shown in FIG. 8, if the plurality of third opening areas (OA3) are provided in the first overcoat layer 510, the first electrode 610 is formed in a structure of an uneven surface comprising a plurality of grooves. Thus, an amount of light reflected on the first electrode 610 provided on the lateral surface of the first overcoat layer 510 being in contact with the third opening area (OA3) is increased so that it is possible to improve an emission efficiency.

Figure 9:
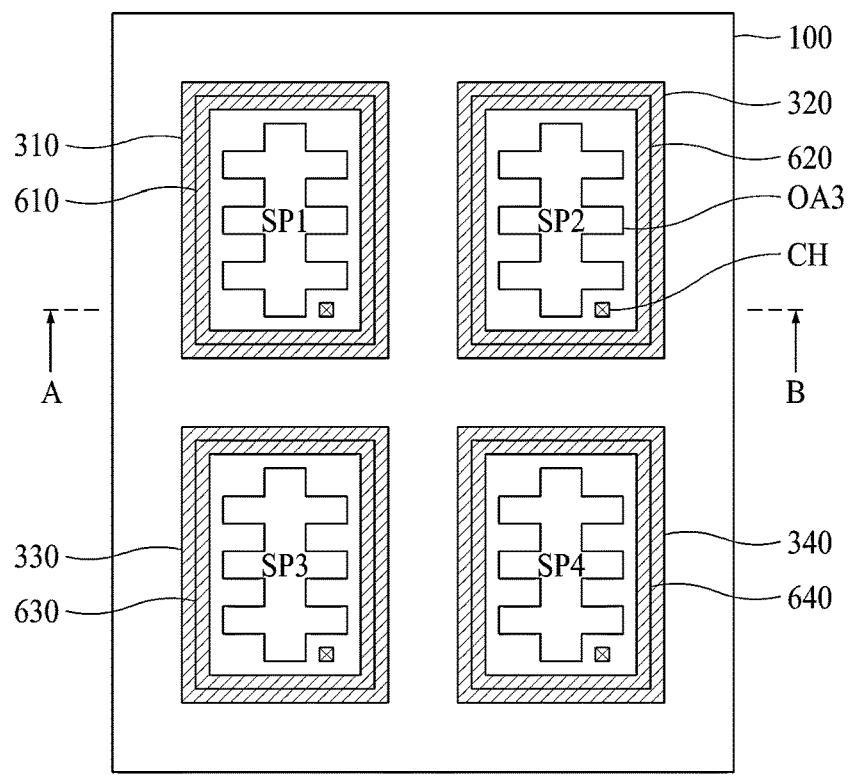
FIG. 9 is a plane view illustrating an electroluminescent display device according to another embodiment of the present disclosure.
Figure 10:
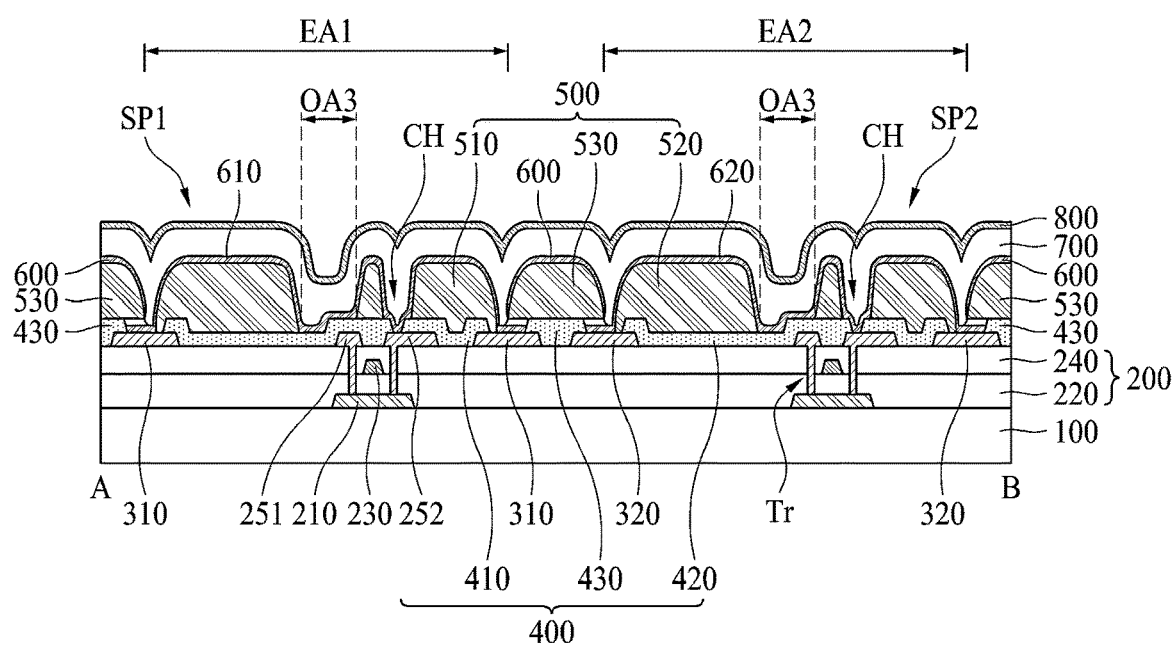
FIG. 10 is a cross sectional view along A-B line of FIG. 9.

FIG. 9 is a plane view illustrating an electroluminescent display device according to another embodiment of the present disclosure. FIG. 10 is a cross sectional view along A-B line of FIG. 9. The electroluminescent display device shown in FIGS. 9 and 10 is different from the electroluminescent display device shown in FIGS. 6 to 8 in that the electroluminescent display device shown in FIGS. 9 and 10 includes an additional contact hole (CH). Thus, the same reference numbers will be used throughout the drawings to refer to the same or like parts, and only the different parts will be described in detail.

As shown in FIG. 9, according to another embodiment of the present disclosure, a third opening area (OA3) and a contact hole (CH) are provided by each individual sub pixel (SP1, SP2, SP3, SP4). Through the contact hole (CH), each first electrode 610, 620, 630 and 640 is connected with a source electrode or drain electrode of a driving thin film transistor provided in each sub pixel (SP1, SP2, SP3, SP4).

In the aforementioned embodiment shown in FIG. 6, the first electrode 610, 620, 630 and 640 is connected with the auxiliary layer 310, 320, 330 and 340 in each sub pixel (SP1, SP2, SP3, SP4), and the auxiliary layer 310, 320, 330 and 340 is connected with the source electrode or drain electrode of the driving thin film transistor provided in each sub pixel (SP1, SP2, SP3, SP4). Especially, as shown in FIG. 7, the first electrode 610 and 620 is connected with the auxiliary layer 310 and 320 in the opening area (OA1, OA2) and the undercut area (UC1, UC2), whereby the additional contact hole is not provided therein.

In contrast, in case of the embodiment shown in FIGS. 9 and 10, the first electrode 610, 620, 630, and 640 is connected with an auxiliary layer 310, 320, 330 and 340 in each sub pixel (SP1, SP2, SP3, SP4), however, the auxiliary layer 310, 320, 330 and 340 is not connected with the source electrode 251 or drain electrode 252 of the driving thin film transistor provided in each sub pixel (SP1, SP2, SP3, SP4). Accordingly, the first electrode 610, 620, 630 and 640 is connected with the source electrode 251 or drain electrode 252 of the driving thin film transistor through the additionally prepared contact hole (CH). Thus, the contact hole (CH) may be not overlapped with the auxiliary layer 310, 320, 330 and 340. Also, the contact hole (CH) may be not overlapped with the third opening area (OA3).

In more detail, as shown in FIG. 10, the contact hole (CH) is provided in a first passivation layer 410 and a first overcoat layer 510 provided in the first sub pixel (SP1), and the drain electrode 252 or source electrode 251 of the thin film transistor (Tr) is exposed via the contact hole (CH). Accordingly, the first electrode 610 provided on the first overcoat layer 510 is connected with the drain electrode 252 or source electrode 251 of the thin film transistor (Tr) through the contact hole (CH). Also, the aforementioned third opening area (OA3) is provided while being spaced apart from the contact hole (CH).

In this case, the first auxiliary layer 310 is not connected with the drain electrode 252 or source electrode 251 of the thin film transistor (Tr) provided in the first sub pixel (SP1). Thus, the first opening area (OA1) and the first undercut area (UC1), in which the first auxiliary layer 310 is exposed, are not overlapped with the contact hole (CH). The first auxiliary layer 310 does not function as the medium for an electrical connection between the first electrode 610 and the drain electrode 252 or source electrode 251 of the thin film transistor (Tr). Thus, it is possible to provide the first auxiliary layer 310 of a non-conductive material.

Similarly, the contact hole (CH) is provided in a second passivation layer 420 and a second overcoat layer 520 provided in the second sub pixel (SP2), and the drain electrode 252 or source electrode 251 of the thin film transistor (Tr) is exposed via the contact hole (CH). Accordingly, the first electrode 620 provided on the second overcoat layer 520 is connected with the drain electrode 252 or source electrode 251 of the thin film transistor (Tr) through the contact hole (CH). Also, the third opening area (OA3) is provided while being spaced apart from the contact hole (CH).

In this case, the second auxiliary layer 320 is not connected with the drain electrode 252 or source electrode 251 of the thin film transistor (Tr) provided in the second sub pixel (SP2). Thus, the second opening area (OA2) and the second undercut area (UC2), in which the second auxiliary layer 320 is exposed, are not overlapped with the contact hole (CH). The second auxiliary layer 320 does not function as the medium for an electrical connection between the first electrode 620 and the drain electrode 252 or source electrode 251 of the thin film transistor (Tr). Thus, it is possible to provide the second auxiliary layer 320 of a non-conductive material.

Figure 11:
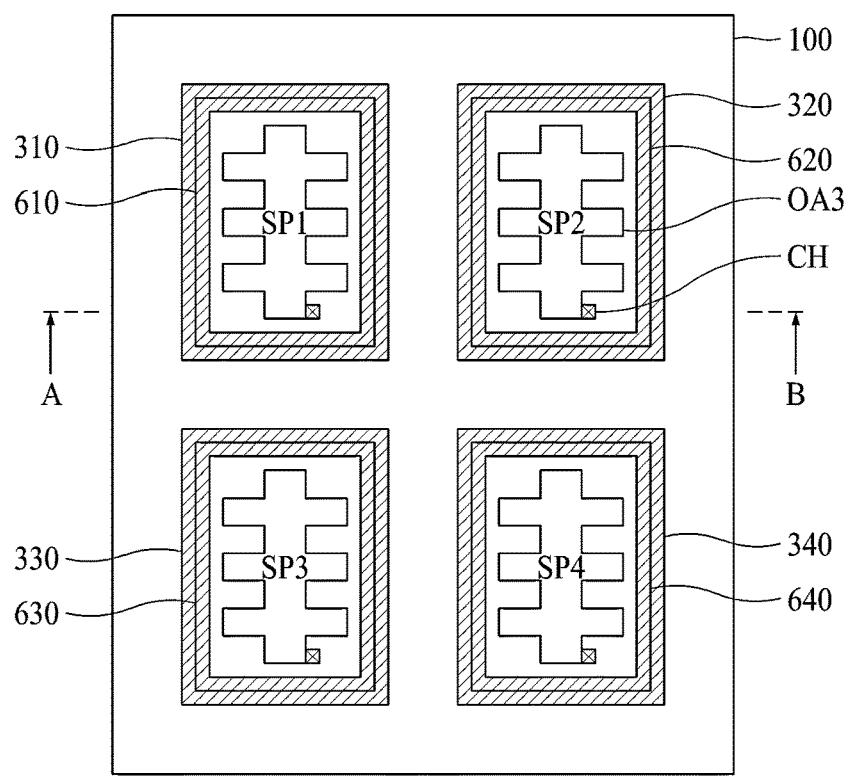
FIG. 11 is a plane view illustrating an electroluminescent display device according to another embodiment of the present disclosure.
Figure 12:
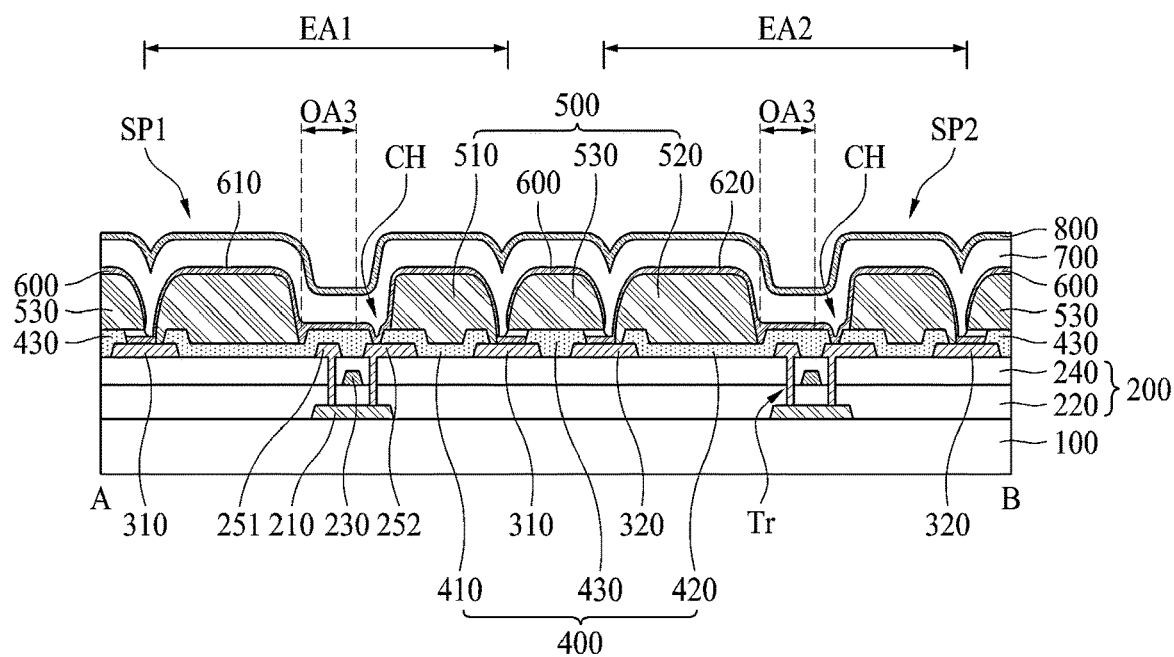
FIG. 12 is a cross sectional view along A-B line of FIG. 11.

FIG. 11 is a plane view illustrating an electroluminescent display device according to another embodiment of the present disclosure. FIG. 12 is a cross sectional view along A-B line of FIG. 11. The electroluminescent display device shown in FIGS. 11 and 12 is different from the electroluminescent display device shown in FIGS. 9 and 10 in that a contact hole (CH) and a third opening area (OA3) are brought into contact with each other in the electroluminescent display device shown in FIGS. 11 and 12.

In the aforementioned embodiment shown in FIGS. 9 and 10, the contact hole (CH) and the third opening area (OA3) are spaced from each other in each individual sub pixel (SP1, SP2, SP3, SP4). However, as shown in FIGS. 11 and 12, the contact hole (CH) and the third opening area (OA3) may be provided while being brought into contact with each other in each individual sub pixel (SP1, SP2, SP3, SP4).

Figure 13A:
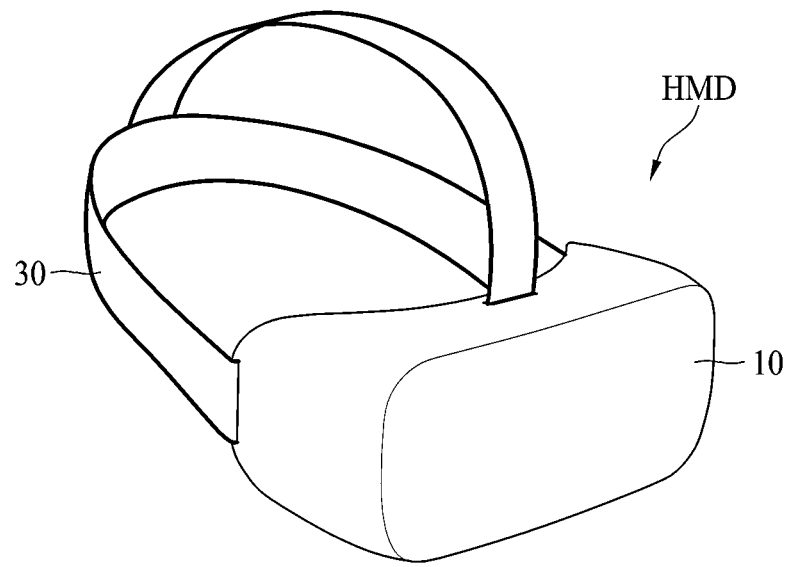
FIGS. 13A to 13C relate to an electroluminescent display device according to another embodiment of the present disclosure, which relate to a head mounted display (HMD) device.
Figure 13B:
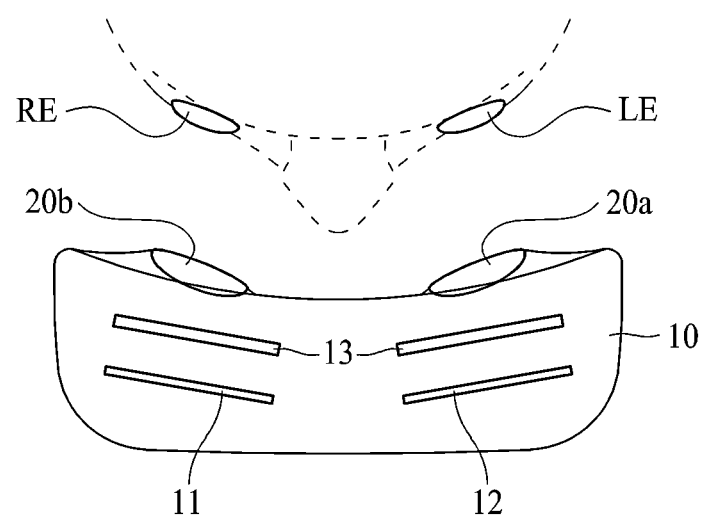
Figure 13C:
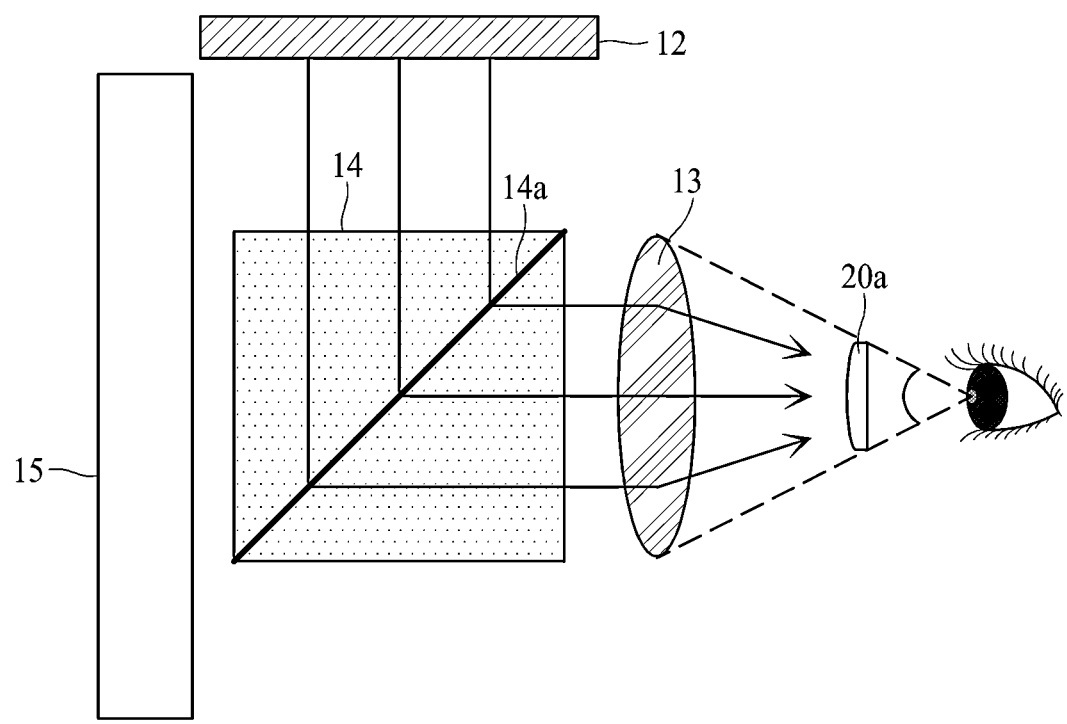

FIGS. 13A to 13C relate to an electroluminescent display apparatus according to another embodiment of the present disclosure and relate to a head-mounted display (HMD) apparatus. FIG. 13A is a schematic perspective view, FIG. 13B is a schematic plan view of a virtual reality (VR) structure, and FIG. 13C is a schematic cross-sectional view of an augmented reality (AR) structure.

As seen in FIG. 13A, the HMD apparatus according to the present disclosure may include an accommodating case 10 and a head-mounted band 30.

The accommodating case 10 may accommodate elements such as a display apparatus, a lens array, and an eyepiece lens.

The head-mounted band 30 may be fixed to the accommodating case 10. The head-mounted band 30 is illustrated as being provided to surround an upper surface of both side surfaces of a user, but is not limited thereto. The head-mounted band 30 may fix the HMD apparatus to a head of a user and may be replaced by a glasses frame type structure or a helmet type structure.

As seen in FIG. 13B, an HMD apparatus having the VR structure according to the present disclosure may include a left-eye display apparatus 12, a right-eye display apparatus 11, a lens array 13, a left-eye eyepiece lens 20a, and a right-eye eyepiece lens 20b.

The left-eye display apparatus 12, the right-eye display apparatus 11, the lens array 13, the left-eye eyepiece lens 20a, and the right-eye eyepiece lens 20b may be accommodated into the accommodating case 10.

The left-eye display apparatus 12 and the right-eye display apparatus 11 may display the same image, and in this case, a user may watch a two-dimensional (2D) image. Alternatively, the left-eye display apparatus 12 may display a left-eye image, and the right-eye display apparatus 11 may display a right-eye image. Each of the left-eye display apparatus 12 and the right-eye display apparatus 11 may be configured as the electroluminescent display apparatus as explained above. In this case, an upper portion (for example, a color filter layer) corresponding to a surface displaying an image may face the lens array 13.

The lens array 13 may be spaced apart from each of the left-eye eyepiece lens 20a and the left-eye display apparatus 12 and may be provided between the left-eye eyepiece lens 20a and the left-eye display apparatus 12. That is, the lens array 13 may be disposed in front of the left-eye eyepiece lens 20a and behind the left-eye display apparatus 12. Also, the lens array 13 may be spaced apart from each of the right-eye eyepiece lens 20b and the right-eye display apparatus 11 and may be provided between the right-eye eyepiece lens 20b and the right-eye display apparatus 11. That is, the lens array 13 may be disposed in front of the right-eye eyepiece lens 20b and behind the right-eye display apparatus 11.

The lens array 13 may be a micro-lens array. The lens array 13 may be replaced by a pin hole array. By using the lens array 13, an image displayed by the left-eye display apparatus 12 or the right-eye display apparatus 11 may be zoomed in by a certain magnification, and thus, a zoomed-in image may be seen by a user.

A left eye LE of a user may be located at the left-eye eyepiece lens 20a, and a right eye RE of the user may be located at the right-eye eyepiece lens 20b.

As seen in FIG. 13C, an HMD apparatus having the AR structure according to the present disclosure may include a left-eye display apparatus 12, a lens array 13, a left-eye eyepiece lens 20a, a transmissive reflection part 14, and a transmissive window 15. In FIG. 13C, for convenience, only left-eye elements are illustrated, and right-eye elements may be the same as the left-eye elements.

The left-eye display apparatus 12, the lens array 13, the left-eye eyepiece lens 20a, the transmissive reflection part 14, and the transmissive window 15 may be accommodated into the accommodating case 10.

The left-eye display apparatus 12 may be disposed in one side (for example, an upper side) of the transmissive reflection part 14 without covering the transmissive window 15. Therefore, the left-eye display apparatus 12 may provide an image to the transmissive reflection part 14 without covering an external background seen through the transmissive window 15.

The left-eye display apparatus 12 may be configured as the electroluminescent display apparatus as explained above. In this case, an upper portion (for example, a color filter layer) corresponding to a surface displaying an image may face the transmissive reflection part 14.

The lens array 13 may be provided between the left-eye eyepiece lens 20a and the transmissive reflection part 14.

The left eye of the user may be located at the left-eye eyepiece lens 20a.

The transmissive reflection part 14 may be disposed between the lens array 13 and the transmissive window 15. The transmissive reflection part 14 may include a reflection surface 14a which transmits a portion of light and reflects the other portion of the light. The reflection surface 14a may be provided so that an image displayed by the left-eye display apparatus 12 travels to the lens array 13. Accordingly, the user may see, through the transmissive window 15, all of the external background and the image displayed by the left-eye display apparatus 12. That is, the user may see one image which includes a real background and a virtual image, and thus, AR may be implemented.

The transmissive window 15 may be disposed in front of the transmissive reflection part 14.

According to one embodiment of the present disclosure, light emitted from the emission layer is reflected on the area of the third overcoat layer, and is then advanced to each emission area so that it is possible to improve an emission efficiency.

According to one embodiment of the present disclosure, the third overcoat layer is decreased in its width so that it is possible to increase a size of the emission area, to thereby improve an aperture ratio and furthermore improve an emission efficiency.

According to one embodiment of the present disclosure, the first electrode is patterned by each individual sub pixel without using an additional mask process so that it is possible to simplify a manufacturing process.

According to one embodiment of the present disclosure, there is no need for an additional bank, that is, there is no need for a process of forming a bank, whereby it enables to simplify a manufacturing process.

According to one embodiment of the present disclosure, on the basis of the characteristics of the deposition process, the thickness of the emission layer deposited on the lateral surface of the third overcoat layer is relatively small so that the resistance is increased in the corresponding area, to thereby lower an occurrence of a leakage current between the neighboring sub pixels.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the electroluminescent display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electroluminescent display device, comprising:
    a substrate having a first sub pixel and a second sub pixel;
    an auxiliary layer provided on the substrate, wherein the auxiliary layer includes a first auxiliary layer configured to surround a periphery of the first sub pixel, and a second auxiliary layer configured to surround a periphery of the second sub pixel;
    a first electrode provided in each of the first sub pixel and the second sub pixel;
    an emission layer provided on the first electrode;
    a second electrode provided on the emission layer;
    a first overcoat layer provided between the first auxiliary layer and the first electrode provided in the first sub pixel;
    a second overcoat layer provided between the second auxiliary layer and the first electrode provided in the second sub pixel; and
    a third overcoat layer provided between the first overcoat layer and the second overcoat layer,
    wherein the first overcoat layer, the second overcoat layer, and the third overcoat layer are spaced apart from each other, and are not connected with each other, and
    wherein the first electrode provided in the first sub pixel is connected with the first auxiliary layer, and the first electrode provided in the second sub pixel is connected with the second auxiliary layer.

2. The electroluminescent display device according to claim 1, further comprising:
    a first opening area provided between the first overcoat layer and the third overcoat layer;
    a second opening area provided between the second overcoat layer and the third overcoat layer;
    a first undercut area which is in communication with the first opening area and is provided below one end of the third overcoat layer; and
    a second undercut area which is in communication with the second opening area and is provided below the other end of the third overcoat layer.

3. The electroluminescent display device according to claim 2,
    wherein the first auxiliary layer is exposed in the first opening area and the first undercut area, and the second auxiliary layer is exposed in the second opening area and the second undercut area,
    wherein the first electrode provided in the first sub pixel extends along upper and lateral surfaces of the first overcoat layer, and is connected with the first auxiliary layer in the first opening area and the first undercut area, and
    wherein the first electrode provided in the second sub pixel extends along upper and lateral surfaces of the second overcoat layer, and is connected with the second auxiliary layer in the second opening area and the second undercut area.

4. The electroluminescent display device according to claim 1, further comprising a conductive layer which is provided on the third overcoat layer and is formed of the same material as that of the first electrode, wherein the conductive layer is not connected with and is spaced apart from the first electrode.

5. The electroluminescent display device according to claim 1, further comprising a first passivation layer provided below the first overcoat layer, a second passivation layer provided below the second overcoat layer, and a third passivation layer provided below the third overcoat layer, wherein the first passivation layer, the second passivation layer, and the third passivation layer are not connected with each other and are spaced from each other.

6. The electroluminescent display device according to claim 5, wherein the first overcoat layer and the first passivation layer are provided in a shape corresponding to a shape of the first sub pixel, and the second overcoat layer and the second passivation layer are provided in a shape corresponding to a shape of the second sub pixel.

7. The electroluminescent display device according to claim 5, further comprising a third opening area provided in the first overcoat layer,
wherein the first electrode provided in the first sub pixel is provided on a lateral surface of the first overcoat layer which is in contact with the third opening area, and is also provided on an upper surface of the first passivation layer which is exposed to the third opening area.

8. The electroluminescent display device according to claim 7,
wherein the first sub pixel is provided with a driving thin film transistor comprising a gate electrode, a source electrode, and a drain electrode,
the first electrode provided in the first sub pixel is electrically connected with the source electrode or drain electrode through a contact hole provided in the first overcoat layer and the first passivation layer, and
the contact hole is spaced apart from the third opening area.

9. The electroluminescent display device according to claim 7,
wherein the first sub pixel is provided with a driving thin film transistor comprising a gate electrode, a source electrode, and a drain electrode,
the first electrode provided in the first sub pixel is electrically connected with the source electrode or drain electrode through a contact hole provided in the first overcoat layer and the first passivation layer, and
the contact hole is in contact with the third opening area.

10. The electroluminescent display device according to claim 1,
wherein the first sub pixel is provided with a driving thin film transistor comprising a gate electrode, a source electrode, and a drain electrode,
the first auxiliary layer is connected with the source electrode or drain electrode, and
the first electrode provided in the first sub pixel is electrically connected with the source electrode or drain electrode through the first auxiliary layer.

11. The electroluminescent display device according to claim 1,
wherein the first sub pixel is provided with a driving thin film transistor comprising a gate electrode, a source electrode, and a drain electrode,
the first auxiliary layer is not connected with the source electrode and the drain electrode, and
the first electrode provided in the first sub pixel is electrically connected with the source electrode or drain electrode through a contact hole.

12. The electroluminescent display device according to claim 1, further comprising a lens array, and a receiving case for accommodating the lens array therein.

13. An electroluminescent display device, comprising:
a substrate provided with a plurality of sub pixels including a first sub pixel and a second sub pixel;
an overcoat layer including a first overcoat layer provided in the first sub pixel on the substrate, a second overcoat layer provided in the second sub pixel on the substrate, and a third overcoat layer provided in the boundary area between the first sub pixel and the second sub pixel on the substrate;
a first electrode provided on the overcoat layer and provided in each of the first sub pixel and the second sub pixel;
an emission layer provided on the first electrode;
a second electrode provided on the emission layer;
a first passivation layer which is provided below the first overcoat layer and is configured to have a relatively small width in comparison to the first overcoat layer;
a second passivation layer which is provided below the second overcoat layer and is configured to have a relatively small width in comparison to the second overcoat layer; and
a third passivation layer which is provided below the third overcoat layer and is configured to have a relatively small width in comparison to the third overcoat layer,
wherein the first passivation layer, the second passivation layer, and the third passivation layer are not connected with each other and are spaced from each other, and
wherein the first overcoat layer, the second overcoat layer, and the third overcoat layer are not connected with each other and are spaced apart from each other.

14. The electroluminescent display device according to claim 13,
wherein the first overcoat layer is provided in a shape corresponding to a shape of the first sub pixel, the second overcoat layer is provided in a shape corresponding to a shape of the second sub pixel, and the third overcoat layer is provided in a mesh shape and is provided in the boundary area between each of the plurality of sub pixels.

15. The electroluminescent display device according to claim 13, wherein the emission layer is continuously provided in the area between the first sub pixel and the second sub pixel as well as the first sub pixel and the second sub pixel, wherein the emission layer includes a first stack configured to emit first colored light, a second stack configured to emit second colored light, and a charge generation layer provided between the first stack and the second stack.

16. An electroluminescent display device, comprising:
a substrate provided with a plurality of sub pixels including a first sub pixel and a second sub pixel;
an overcoat layer including a first overcoat layer provided in the first sub pixel on the substrate, a second overcoat layer provided in the second sub pixel on the substrate, and a third overcoat layer provided in the boundary area between the first sub pixel and the second sub pixel on the substrate;
a first electrode provided on the overcoat layer and provided in each of the first sub pixel and the second sub pixel;
an emission layer provided on the first electrode;
a second electrode provided on the emission layer;

a first opening area provided between the first overcoat layer and the third overcoat layer;

a second opening area provided between the second overcoat layer and the third overcoat layer;

a first undercut area which is in communication with the first opening area and is provided below one end of the third overcoat layer; and a second undercut area which is in communication with the second opening area and is provided below the other end of the third overcoat layer, wherein the first overcoat layer, the second overcoat layer, and the third overcoat layer are not connected with each other and are spaced apart from each other, wherein the first electrode provided in the first sub pixel extends to the first undercut area via the first opening area along upper and lateral surfaces of the first overcoat layer, and wherein the first electrode provided in the second sub pixel extends to the second undercut area via the second opening area along upper and lateral surfaces of the second overcoat layer.

17. The electroluminescent display device according to claim 16, further comprising a conductive layer which is provided on the third overcoat layer and is formed of the same material as that of the first electrode, wherein the conductive layer is not connected with and is spaced apart from the first electrode.

18. The electroluminescent display device according to claim 16, further comprising a first auxiliary layer exposed to the first opening area and the first undercut area, and a second auxiliary layer exposed to the second opening area and the second undercut area, wherein the first electrode provided in the first sub pixel is connected with the first auxiliary layer in the first opening area and the first undercut area, and the first electrode provided in the second sub pixel is connected with the second auxiliary layer in the second opening area and the second undercut area.

* * * * *